United States Patent [19]

Voss

[11] 4,071,814

[45] Jan. 31, 1978

[54] DUAL-OUTPUT BRIDGE FOR BIDIRECTIONAL CONTROL

[76] Inventor: William Baker Voss, 387 N. Kenter Ave., Los Angeles, Calif. 90049

[21] Appl. No.: 697,341

[22] Filed: July 6, 1976

[51] Int. Cl.$^2$ .................................. G01R 17/10
[52] U.S. Cl. ........................... 323/75 B; 323/75 N; 324/DIG. 1
[58] Field of Search ............... 323/75 B, 75 H, 75 N; 324/DIG. 1; 73/361, 362 AR, 359, 204

[56] References Cited

U.S. PATENT DOCUMENTS

| | | | |
|---|---|---|---|
| 2,759,150 | 8/1956 | Rosenbaum | 323/75 N |
| 3,161,821 | 12/1964 | Price et al. | 323/75 N |
| 3,439,258 | 4/1969 | Van Leeuwen | 323/75 N |
| 3,800,592 | 4/1974 | Jones, Jr. | 73/204 |

OTHER PUBLICATIONS

Instruments & Control Systems, Feb. 1967, p. 75.

*Primary Examiner*—Gerald Goldberg

[57] ABSTRACT

A circuit for controlling two single (or one combined), oppositely directed controlling agents which operate on some controllable parameter, such as temperature, in a manner whereby the parameter is maintained within a prescribed narrow range or deadband, such that the parameter is free to drift within the two boundaries of the deadband but in which it actuates the appropriate controlling agent at or near either boundary to prevent the parameter from drifting appreciably beyond the deadband. Central to the method is a modification of a Wheatstone bridge in which a fifth arm is added to the four which normally compose a bridge, thereby enabling the bridge to generate two separate output signals. The fifth arm is a small, single resistor, preferably variable, placed in series with and between two normally adjacent legs of a bridge. The two output signals thus formed, after being suitably transformed by comparators or preamplifiers, then amplified and applied respectively to the appropriately directed controlling agents, then define the upper and lower boundaries of the controlling deadband. The width, or range, of the deadband is proportional to the resistance of the fifth arm of the bridge.

5 Claims, 5 Drawing Figures

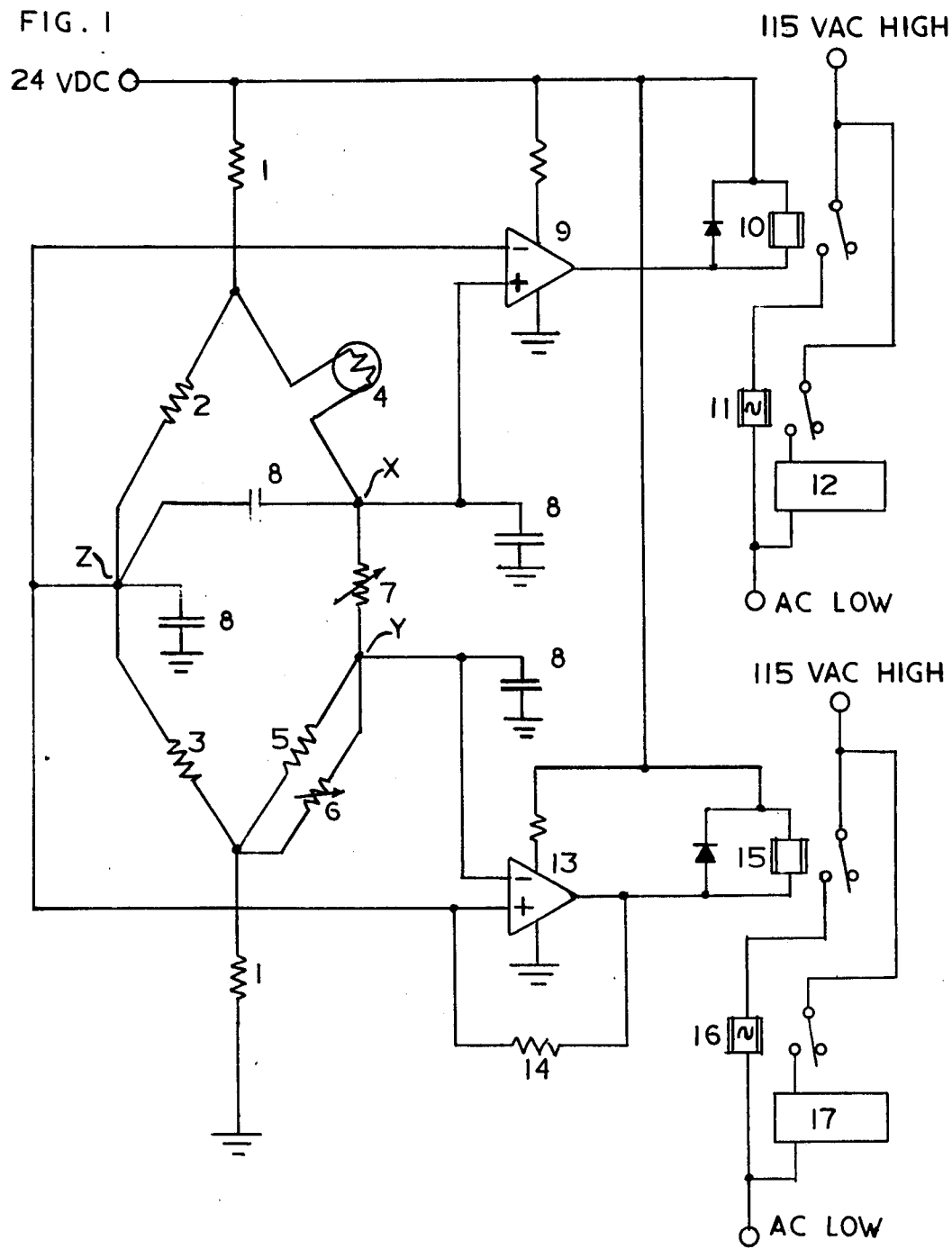

FIGURE 3
| SUB-FIG. | AMPLIFIERS | | CHARACTERISTICS | |
|---|---|---|---|---|
| | INPUTS | OUTPUTS | SEPARATE | COMBINED |
| A | S.E. | S.E. | 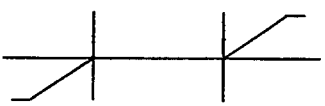 | 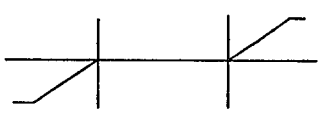 |
| B | DIF. | ″ | 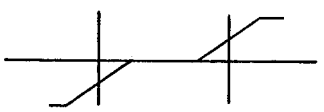 | 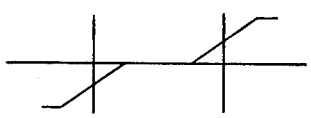 |
| C | ″ | ″ | 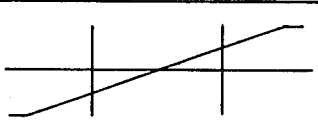 | 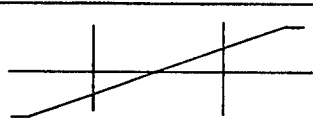 |
| D | ″ | ″ | 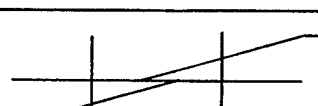 | 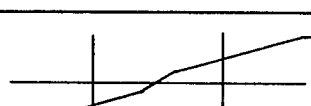 |
| E | DIF. | DIF. | 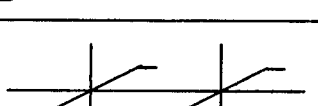 | 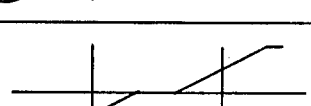 |
| F | ″ | ″ | 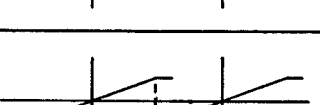 | 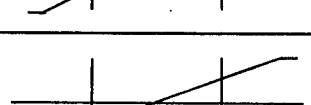 |
| G | ″ | ″ | 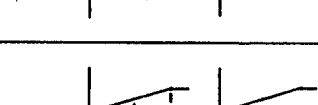 |  |
| H | ″ | ″ |  |  |
| I | S.E., REVERSE POLARITY | S.E. | 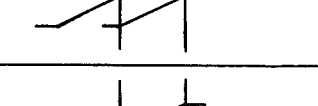 | 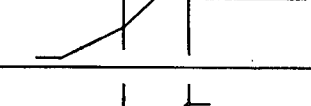 |
| J | A.C. | A.C. | 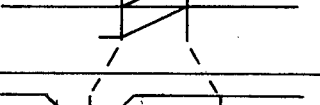 |  |

DUAL-OUTPUT BRIDGE FOR BIDIRECTIONAL CONTROL

BACKGROUND OF THE INVENTION

In the normal art, Wheatstone or Wheatstone-derived bridges are constructed with a single output signal generated by the bridge. This signal is used either for measurement or control. Usually one of the four arms becomes a sensor or detector, although occasionally two opposite arms employ separate sensors for increased sensitivity. If it should be desired to provide two output signals at proximate but different levels of the signal, say to define a control or measurement band in a parameter, then two different bridges are used, which requires a separate sensor for each bridge. Rarely, a bridge will contain six arms (of which two or more are sensing) arranged with two of the arms on one side of the typical bridge diamond and four on the other side, but the four elements interplay for self-compensation purposes and only one signal emanates from the bridge. Quite often a four-arm bridge will have five elements in it, the fifth element being a variable resistor between two arms, but the fifth element is then center-tapped, such that the bridge has only one output signal (e.g., the Kelvin double-bridge).

BRIEF SUMMARY OF THE INVENTION

A Wheatstone bridge has been modified by the addition of a small, single resistor to provide two simultaneous output signals in place of the usual single signal. These two signals are used in a bidirectional control system to define the upper and low limits (or boundaries) of a deadband within the range of the parameter which is simultaneously monitored and controlled by the bridge. In the primary application of the invention the controlled parameter is temperature. The deadband is 54° ± 1° F. The control system actuates a heater if the controlled temperature falls below the deadband and it actuates a refrigerator if it climbs above the deadband.

BRIEF DESCRIPTION OF THE DRAWINGS

FIG. 1 is an electrical schematic of a system which embodies the bidirectional control method, using temperature as the controlled parameter and using a refrigerator and a heater as the controlling agents.

FIG. 3 summarizes the different response characteristics that are possible in proportional control.

DETAILED DESCRIPTION OF THE INVENTION

General Description of the Invention

In the present invention two bridges are combined into one in the simplest manner possible. In between two adjacent arms of the four-arm diamond which is normally associated with the Wheatstone bridge, a resistor is inserted and the ends of the resistor are used as the sources of two output signals. The opposite corner of the diamond becomes the return path for both signals. The inserted resistor may be fixed but is preferably variable. Thus, a dual output bridge has five principal elements: two in series on one side and three in series of the other side. These elements are illustrated by Arms 1 through 5 (Items 2 through 7) in FIG. 1. (FIG. 1 is described in detail in the section "A Concrete Example".) The two signals that are produced by the bridge are used to produce a small but useful deadband (also called passband or window) within the range of whatever parameter is being sensed - and ultimately controlled - by the bridge. This deadband may have sharp boundaries for bang-bang control methods, as in the example shown in FIG. 1, or it may have fuzzy boundaries for what may be called mixed control methods. Here, "mixed" means that some proportional control has been added. The terms "sharp" and "fuzzy" are over-simplified in that they neglect the hysteresis effect that may be introduced intentionally, or may occur naturally, at the boundaries of the deadband. Also, other complications are possible, as this discussion will disclose.

Figure 2A:
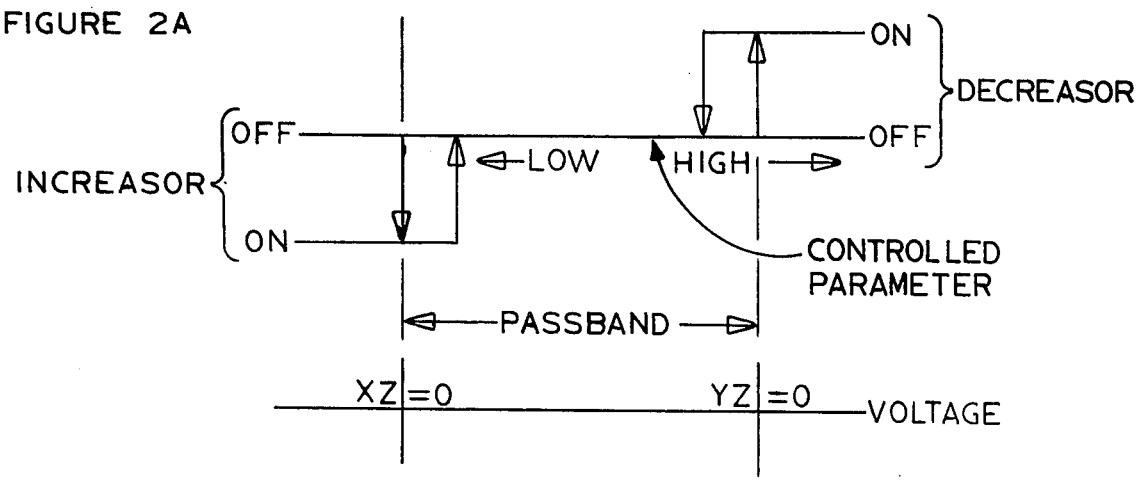
FIG. 2 shows the two response characteristics that are typical of the control method, FIG. 2A being for bang-bang (on-off) control, and FIG. 2B for proportional control.

The output response characteristic for bang-bang control is shown in FIG. 2A. Hysteresis is represented by double arrows. (Incidentally, the deadband concept is very convenient for accommodating intentional or unintentional hysteresis in control systems.) The controlled parameter, such as temperature, is represented by the horizontal axis, and the states of the controlling agents are represented by the vertical axis. The controlling agents are subsequently called "effectors." These effectors — consisting of a "decreasor" and an increasor — act individually to drive the controlled parameter back into the deadband. (The decreasor corresponds to the refrigerator which is shown as Item 17 of FIG. 1, etc.). The positioning of these opposing effectors above and below the horizontal axis is arbitrary. Both could have been shown above the axis. The horizontal axis can also represent voltage variation with respect to point Z (see FIG. 1) within the bridge. At the left-hand vertical dashed line (between FIG. 2A and 2B) the voltage between points Z and X equals 0; at the right-hand line the voltage between points Z and Y equals 0.

For bang-bang control methods the two output signals from the bridge are conducted respectively to two zero-crossing detectors (comparators). The outputs of the two comparators are relayed through cascades of power-amplifying relays (or electronic switches such as triacs) to two opposing effectors such that the appropriate effector is actuated when the "controlled" parameter drifts to the edge of its deadband. Within this deadband the parameter is actually uncontrolled, i.e., is free to drift under the influence of external forces.

Figure 2B:
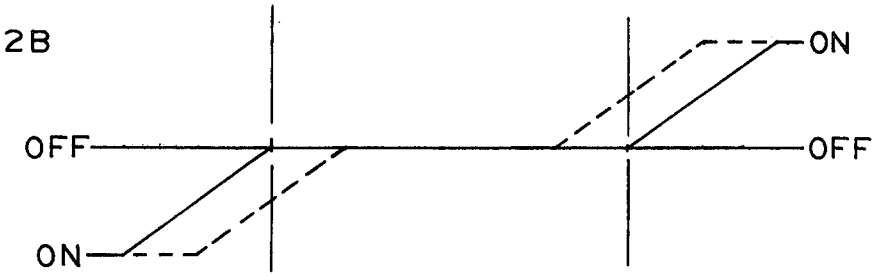

Response characteristics for mixed control methods can take many forms. Two of the simpler forms are shown qualitatively in FIG. 2B. Here, some labels have been omitted for simplicity. The horizontal and vertical axes are like those in FIG. 2A but the double parallel lines represent amplifier differences rather than hysteresis. (Hysteresis could be added, if desired.) Obviously, effectors for mixed control methods must be of a porportional or analog nature themselves. For example, mechanical refrigerators, being on/off devices, would be unsuitable. The comparators and relays associated with bang-bang control are replaced by preamplifiers and power amplifiers, respectively. In FIG. 2B the continuous lines are provided by single-ended amplifiers and the dashed lines by amplifiers with differential inputs and single-ended outputs. Note the positions of these sloping characteristics with respect to the deadband, which is shown extending downward from FIG. 2A. The sloping characteristics could be moved horizontally by providing voltage offsets (biases) to the amplifiers, but the simplest method of offsetting is merely to change the value of the resistor in Arm 5 of the bridge.

By changing the types of amplifiers employed, quite a variety of response characteristics can be obtained - all classed under mixed or pure proportional control methods. In FIG. 3 are shown several of the characteristics obtainable from various combinations of linear amplifiers. The subfigures A and B of FIG. 3 repeat the two characteristics that are combined in FIG. 2B. The "Amplifier" columns actually describe the amplifier cascades associated with each characteristic. The "Inputs" pertain to the preamplifiers and the "Outputs" pertain to the power (driver) amplifiers. S.E. means single-ended; DIF means differential. All except Subfigure J and DC amplifiers (and are used with DC bridges). The two vertical lines extending through each "Characteristic" column are obviously the deadband boundaries defined by XZ = 0 and YZ = 0, respectively. The effectors, which are driven by the power amplifiers, may be either unidirectional, in which case two oppositely directed effectors are required, or they may be bidirectional, in which case only one is required. A bidirectional effector is reversible in its direction of action, depending on the direction of current applied through it. A bidirectional effector is differentiated from bidirectional control. In general, in the electrical sense, unidirectional or bidirectional effectors are also unipolar or bipolar, respectively. Also in general, the unidirectional effectors are driven by single-ended-output amplifiers and the bidirectional effectors by differential-output amplifiers, however the reverse types of arrangements are also feasible. Some examples of unidirectional effectors are ohmic heaters and simple, variable-pressure hydraulic actuators. A classic example of a bidirectional effector is a peltier element, which heats or cools depending on the direction of the current through it. Another example is a reversible electric motor.

It is noted that all of the differential output examples in FIG. 3 (Subfigures E through H) involve some degree of inefficiency in their use because the effectors they drive tend to actively oppose each other within the deadbands. A compensating advantage is obtained in some cases, however, due to an increased speed of response to an external stimulus. A similar condition exists for single-ended outputs wherever an overlap is obtained, as in D and I of FIG. 3.

Only in A, B, and E of FIG. 3 is free drift possible (at least among DC amplifiers).

It is noted that the deadband may be reduced even more than is shown in H and I, i.e., to zero. In that case Arm 5 is deleted and this invention no longer applies.

Response characteristics may also be non-linear and are not restricted to the linear or piece-wise linear characteristics shown in FIGS. 2B and 3.

Whenever comparators or single-ended amplifiers are used, electrical power sources are limited to DC, obviously. The dual output bridge is amenable to AC as a power source if only AC amplifiers are employed in the two amplifying chains. Effectors for use with AC power amplifiers must be unidirectional and, obviously, must be oppositely directed. They will be operating simultaneously at all but the deadband boundaries. One of several possible AC characteristics is shown in J of FIG. 3.

Figure 4:
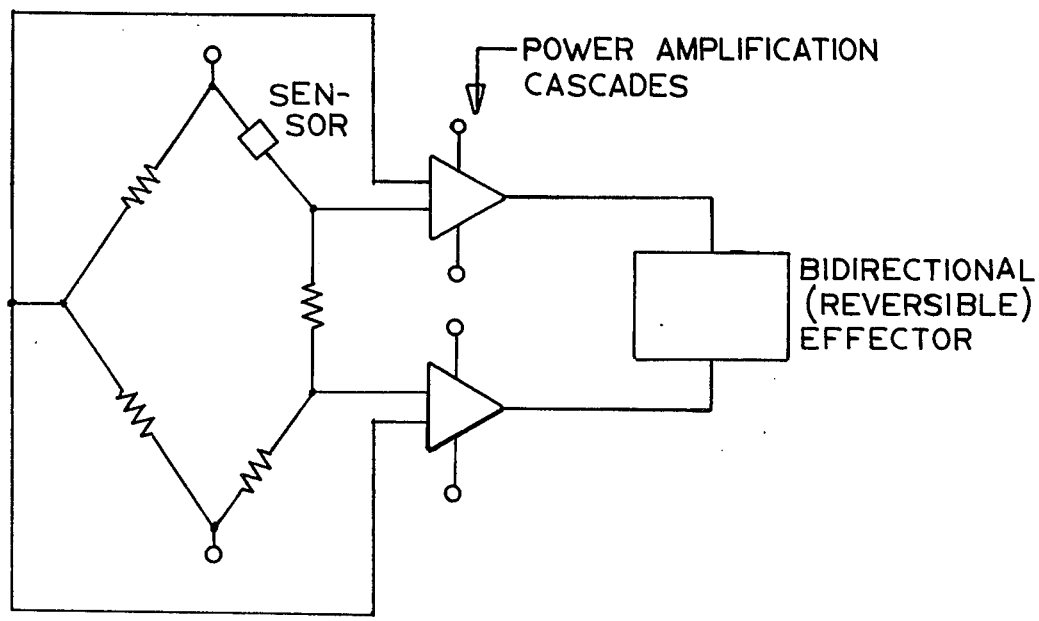
FIG. 4 is a block diagram of a bidirectional, proportional control system in which two controlling agents are combined into one bidirectional (reversible) controlling agent.

Consider the DC-powered circuits again. Two methods are normally available for connecting the power amplifiers (or relays) to their respective effectors. One is to have the effectors connected as pull-up or pull-down elements, respectively, between the amplifiers and the positive or negative power sources. The other is to connect the effectors to ground, causing the driving amplifiers to act as power sources. A third method is available for use with bidirectional effectors. This is shown in FIG. 4. One amplifier sources current while the other sinks the current. This type of arrangement is particularly suitable for use with a peltier junction circuit for cooling or heating.

A Concrete Example

In the inventor's own example, a bang-bang control circuit is connected through relays to both a refrigerator and heater, which together control the temperature inside a small, insulated shed for the storage of wine. The controlled temperature level and range in actual use is 54° ±1° F, although almost any level and range could have been selected. (If the efficiency of the refrigerator were not a problem, a range of ±0.2° F could have been obtained). FIG. 1 shows a detailed schematic of the inventor's system. Twenty-four volts of DC power is furnished to the dual output bridge through two voltage-dropping resistors, Item 1, which total 200K ohms. Two resistors, Items 2 and 3, (18K ohms each), comprise Arms 1 and 2 of the bridge. Item 4, which is Arm 3 of the bridge, is a thermister (Fenwell GB41PZ) and is 18.9K ohms at 54° F. Item 5 is 18K ohms; Item 6 is 550K ohms maximum, and it determines (by adjustment) the level of the temperature. Items 5 and 6 comprise Arm 4 of the bridge. Item 7 is 1000 ohms maximum and forms the new fifth arm of the bridge. The adjustment of Item 7 determines the width of the deadband width within which the system operates (here 2° F when Item 7 is about 500 ohms). The addition of Item 7 provides two output voltages, represented by XZ and YZ, which are routed, respectively, to the inputs of two comparators (National Semiconductor LM311's), Items 9 and 13. The outputs of the comparators either block or unblock the currents through the small DC relays, Items 10 and 15. (These could be replaced with DC switching transistors). These relays actuate or de-actuate the AC power relays, Items 11 and 16. (These, in turn, could be replaced with triacs). The AC relays control the actions of the room heater, Item 12, and room refrigerator, Item 17. (The compressor for the refrigerator is outside of the room, naturally). As the thermister, Item 4, cools, its resistance increases, lowering voltage X below Z. The instant XZ becomes negative, the output of Item 9 switches from high to low, which closes the relay contacts of Item 10, then 11, and actuates the room heater. Conversely, as Item 4 warms, Y rises above Z. The instant YZ becomes positive, a similar sequence of actions actuates the room refrigerator. A positive feedback resistor of 12 megohms, Item 14, is provided (following common practice) to add a desirable hysteresis in the action of the refrigerator. In order to eliminate instability, four 0.1 μF capacitors, Items 8 are required, and the leads to Item 4 must be at low capacitance. It may be necessary to add adjustable biasing resistors (not shown) to the inputs of Items 9 and 13 to accommodate individual variations in the comparators (or amplifiers, if used).

Other Applications

The type of circuit presented herein is not limited to a thermister as its sensing element. Any resistive element — with either positive or negative, linear or non-linear characteristic — may be used. A second sensing element may also be used to replace the resistor in Arm 3 if greater sensitivity is desired. Naturally, other parameters than temperature may be sensed. Pressure or force may be sensed by strain gauges, which are compatible with bridge use. Excursion, velocity, or acceleration (either linear or rotational for all three) are similarly amenable to control by dual output bridges. Light and other forms of radiation can be sensed resistively. In general, any parameter which can be sensed by a resistive element and which is capable of being controlled by increasors and decreasors (i.e., bidirectionally) is covered by this invention.

Voltage- or current-generating sensors can also be accommodated in several ways to provide useful dual outputs, but the circuit then ceases to be a bridge in the conventional sense (or the sense of this specification) and thus lies outside of the scope of this invention.

A few areas of application which are compatible with the resistive sensors include: (1) linear positioning or angular positioning of such devices as robot arms, antennas, gyroscopes, (2) liquid level control, (3) thickness control, (4) reversible electric motors or torquers (in the manner of FIG. 4), and (5) light-sensing exposure control systems on cameras.

Variations in Bridge Composition

Another possible version of the dual output bridge is to add a sixth resistor between Arms 1 and 2. Thus the point Z in FIG. 1 would be split into $Z_1$ and $Z_2$. The voltages which are fed into the two comparators or preamplifiers are represented by $XZ_1$ and $YZ_2$ respectively. In DC or straight AC bridges this new resistor, Arm 6 of the bridge, confers no particular advantage. It merely serves to reduce the effectiveness of Arm 5 in providing the useful deadband. Also, it reduces the overall sensitivity of the bridge by diluting the effects of Arms 1 through 4.

When AC or differential-input DC amplifiers are used it is possible to introduce modulation into the bridges (either 5-arm or 6-arm bridges). Either the sensor or the fifth resistor in a 5-arm bridge, or the sensor or the fifth or sixth resistor in a 6-arm bridge, is susceptible to modulation of almost any conceivable kind. Typical kinds are: amplitude, frequency, or phase modulation. This is introduced into the bridge from one or more external modulating sources by providing appropriate positive or negative (varying) voltages across the modulated leg of the bridge, say from Point X to Point Y for Arm 5. The two bridge outputs, then, carry the modulated signal, which may be used for whatever purpose desired.

What I claim is new and desire to secure by Letters Patent is:

1. A method of controlling two oppositely directed, on/off-type effectors (which are electrically powered controlling agents) by a five-arm bridge with two output signals, plus means for converting these signals into switched power for driving the effectors, one signal per effector, said method comprising in detail:

1. a D.C. bridge which has two input terminals, as for a Wheatstone bridge, and means to power same, but which has three instead of two output terminals, two of the said three output terminals being formed by the addition of a fifth arm to a normal Wheatstone bridge, said fifth arm lying between two of the series-connected arms which normally compose one side of a Wheatstone bridge, and said fifth arm being a variable resistor whose resistance is substantially smaller than the four remaining normal arms of the bridge, the two output terminals being thus formed by the said fifth arm generating two separate output signals, the return path for both signals being the third of the said three output terminals and lying on the side of the bridge opposite to the fifth arm, the voltages of the two signals differing slightly from each other but both varying together in response to a resistive sensor which composes one of the four normal arms of the bridge, the resistance of said sensor varying negatively (inversely) with the controllable parameter which it senses, the said two output signals of the bridge defining a deadband (passband), each boundary of which corresponds to a zero voltage of one of the said two signals;

2. two means for detecting zero-crossings of D. C. voltages and switching between dual output states in response, the inputs of said means being connected to said two output signals of the bridge on a one-to-one basis;

3. two means in cascade for amplifying the said dual output states, such amplifications being adequate for actuating appropriate effectors;

4. two oppositely directed on/off type effectors, one of which, when electrically actuated, operates at full power on the aforesaid parameter to decrease that parameter, and the other of which, when electrically actuated, operates at full power on the same parameter to increase that parameter, either resultant change in the said parameter affecting, in turn, the response of the aforesaid sensor to the parameter, the inputs of said effectors being connected on a one-for-one basis to the outputs of said amplifying means in cascade, all connections from the aforesaid bridge to the effectors being in such a manner that when the said parameters remains within the aforesaid deadband defined by the two outputs of the bridge neither effector is actuated but when the parameter, while drifting under external influence, crosses either aforesaid boundary of the deadband, that effector is selectively actuated which drives the parameter back into the deadband, thereby becoming deactuated again.

2. In the circuit of claim 1, the replacement of the said sensor whose resistance varies negatively with the said controllable parameter, by a sensor whose resistance varies positively with the said controllable parameter; further, the interchange, in electrical connection, of the parameter-increasing effector and its corresponding amplifying means in cascade, with the parameter-decreasing effector and its corresponding means in cascade, such electrical interchange being at the two outputs of the said zero-crossing detection means, and preserving the ability of the said two effectors to drive the said drifting parameter back into the deadband, thus maintaining control of the said parameter.

3. In the circuit of claim 1, the specific application of temperature as the said controllable parameter, the use of a thermister as the said sensor, the use of an electrical heater as the increasing effector, and the use of a refrigerator as the decreasing effector.

4. A circuit of controlling two oppositely directed proportional effectors by a five-arm bridge with two output signals, plus means for converting these signals into amplified power for driving the effectors, one signal per effector, said circuit comprising in detail:

1. a D.C. bridge which has two input terminals, as in a Wheatstone bridge, and means to power same, but which has three instead of two output terminals, two of the said three output terminals being formed by the addition of a fifth arm to a normal Wheatstone bridge, said fifth arm lying between two of the series-connected arms which normally compose one side of a Wheatstone bridge, and said fifth arm being a variable resistor whose resistance is substantially smaller than the four remaining normal arms of the bridge, the two output terminals being thus formed by the said fifth arm generating two separate output signals, the return path for both signals being the third of said three output terminals and lying on the side of the bridge opposite to the fifth arm, the voltages of the two signals differing slightly from each other but both varying together in response to a resistive sensor which composes one of the four normal arms of the bridge, the resistance of said sensor varying negatively (inversely) with the controllable parameter which it senses, the said two output signals of the bridge defining a deadband (passaband), each boundary of which corresponds to a zero voltage of one of the said two signals;

2. two means in cascade for amplifying the said two signals, the outputs being D.C. voltages which are proportional to the input signals, at least in the region beyond the boundaries of the deadband, the inputs of said means being connected to said two output signals of the bridge on a one-to-one basis, the said cascades starting with preamplifiers and ending with power amplifiers able to drive the said effectors from zero to full-scale power, said effectors being identified in (3), which follows;

3. two oppositely directed, proportional effectors, one of which operates on the aforesaid parameter to decrease that parameter, and the other of which operates on the same parameter to increase that parameter, either resultant change in the said parameter affecting, in turn, the response of the aforesaid sensor to the parameter, the inputs of said effectors being connected on a one-for-one basis to the outputs of said amplifying means in cascade, the degree of operation of either effector on the said parameter being proportional to the amplified signal which drives it, all connections from the bridge to the effectors being of such polarity and in such a manner that when the parameter, while drifting under external influence, crosses either aforesaid boundary of the deadband, that effector is selected which tends to drive the parameter back into the deadband, the degree operation of the effector being between 0 and 50 percent of full scale at said boundary;

the width of said deadband being proportional to the resistance of said fifth arm of the bridge.

5. In the circuit of claim 4 the substitution of a single, bidirectional (reversible) proportional effector in place of the two said oppositely directed proportional effectors, the input of the effector being connected to both power amplifiers of the aforesaid amplifying means in cascade in a manner such that the direction of current from the amplifiers determines the direction of operation of the effector on the aforesaid parameter, the resulting direction and degree of operation of the effector being otherwise unchanged from that of the two effectors of claim 20.

* * * * *

UNITED STATES PATENT AND TRADEMARK OFFICE
CERTIFICATE OF CORRECTION

PATENT NO. : 4,071,814
DATED : January 31, 1978
INVENTOR(S) : William Baker Voss It is certified that error appears in the above-identified patent and that said Letters Patent are hereby corrected as shown below:

Column 2, line 32, "increaser" to -- "increasor" --.

Column 3, line 21, before "DC" delete "and" and substitute --are--;

Column 5, line 39, delete "YZ $_2$" and substitute --YZ$_2$,--;

Claim 1, line 1, delete "method of" and substitute --circuit for--;

Claim 1, column 6, line 47, "parameters" should be singular

Claim 4, line 1, delete "of" and substitute --for--;

Claim 4, line 28, correct the spelling of "passband";

Claim 5, line 11 "Claim 20" should be Claim 4.

Signed and Sealed this

Eighteenth Day of July 1978

[SEAL]

Attest:

RUTH C. MASON
Attesting Officer

DONALD W. BANNER
Commissioner of Patents and Trademarks